United States Patent
Tai et al.

(10) Patent No.: US 6,828,776 B2
(45) Date of Patent: Dec. 7, 2004

(54) METHOD FOR ANALYZING DEFECT INSPECTION PARAMETERS

(75) Inventors: Hung-En Tai, Taipei Hsien (TW); Haw-Jyue Luo, Hsin-Chu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/604,685

(22) Filed: Aug. 11, 2003

(65) Prior Publication Data

US 2004/0124830 A1 Jul. 1, 2004

(30) Foreign Application Priority Data

Dec. 31, 2002 (TW) ........................ 91138167 A (51) Int. Cl.⁷ .................... G01R 1/04; G01R 31/26
(52) U.S. Cl. .................... 324/158.1; 324/765
(58) Field of Search .................... 324/158.1, 750, 324/764, 760, 765; 438/14–18; 250/307–310, 559; 382/141, 145, 147

(56) References Cited

U.S. PATENT DOCUMENTS

| | | | | |
|---|---|---|---|---|
| 4,618,938 A | * | 10/1986 | Sandland et al. | 382/148 |
| 5,761,064 A | * | 6/1998 | La et al. | 702/35 |
| 6,016,562 A | * | 1/2000 | Miyazaki et al. | 714/724 |
| 6,246,787 B1 | * | 6/2001 | Hennessey et al. | 382/141 |
| 6,477,685 B1 | * | 11/2002 | Lovelace | 716/4 |
| 6,559,662 B1 | * | 5/2003 | Yamada et al. | 324/751 |
| 6,583,634 B1 | * | 6/2003 | Nozoe et al. | 324/751 |
| 6,628,817 B2 | * | 9/2003 | Ishikawa et al. | 382/141 |
| 6,703,850 B2 | * | 3/2004 | Nozoe et al. | 324/751 |
| 6,757,621 B2 | * | 6/2004 | Mizuno et al. | 702/35 |
| 2002/0034326 A1 | * | 3/2002 | Ishikawa et al. | 382/149 |

FOREIGN PATENT DOCUMENTS

JP      2001168160 A  *  6/2001  ........... H01L/21/66

* cited by examiner

*Primary Examiner*—Luan Thai
*Assistant Examiner*—Jermele Hollington
(74) *Attorney, Agent, or Firm*—Winston Hsu (57) ABSTRACT

The claimed invention method is for analyzing defect inspection parameters. The method includes searching for the defect inspection parameters of a plurality of lots of products from a database, classifying the plurality of lots of products into at least a qualified group and a failed group according to the defect inspection parameters, searching for a process step correlated to a defect inspection item from the database, searching for manufacturing equipment through which the qualified group has passed in the process step and the manufacturing equipment through which the failed group has passed in the process step, and determining the manufacturing equipment through which the probability that the failed group having passed which is greater than that of the qualified group.

10 Claims, 6 Drawing Sheets

METHOD FOR ANALYZING DEFECT INSPECTION PARAMETERS

BACKGROUND OF INVENTION

1. Field of the Invention

The present invention relates to a method for analyzing process parameters, and more particularly, to a method for analyzing defect inspection parameters.

2. Description of the Prior Art

In a semiconductor manufacturing technique, many processes, such as the photolithography processes, the etching processes, and the ion implantation processes are required to complete the fabrication of a semiconductor product. That means a large number of equipment and complicated procedures are utilized in a semiconductor manufacturing process. Therefore, those of ordinary skill in the art are concentrated on ensuring the proper operation of equipment, sustaining or improving production yield rate, detecting and verifying problems, and periodically maintaining facilities for production, etc, so as to maintain the company's operation in good progress and produce products having good quality.

In order to identify the semiconductor processing problems, the following data, such as the process parameter data, the in-line quality control (in-line QC) data, the defect inspection data, the sample test data, the wafer test data, and the final test data, are analyzed. The defect inspection data is acquired by inspecting the defects in each layer on the wafer. The defect inspection data includes the total count of defects, the adder count of defects, and the class count of defects. The data obtained from defect inspection is usually represented by a defect distribution map.

Figure 1:
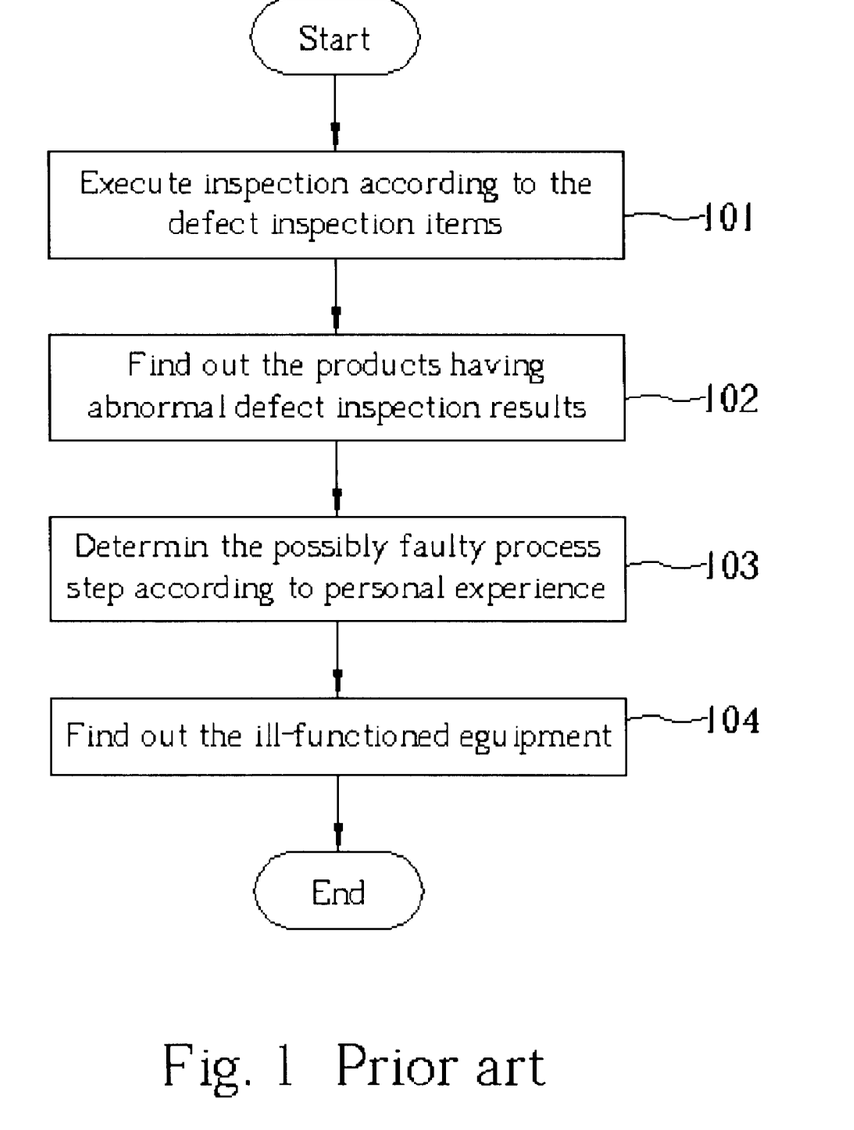
FIG. 1 is a flow chart of a prior art method for analyzing defect inspection parameters.

Please refer to FIG. 1. FIG. 1 is a flow chart of a prior art method for analyzing defect inspection parameters. As shown in FIG. 1, step 101 is first executed by those of ordinary skill in the art to perform inspection according to various defect inspection items to each wafer. For example, the total count of defects in an intermetal dielectric layer is inspected.

Figure 2:
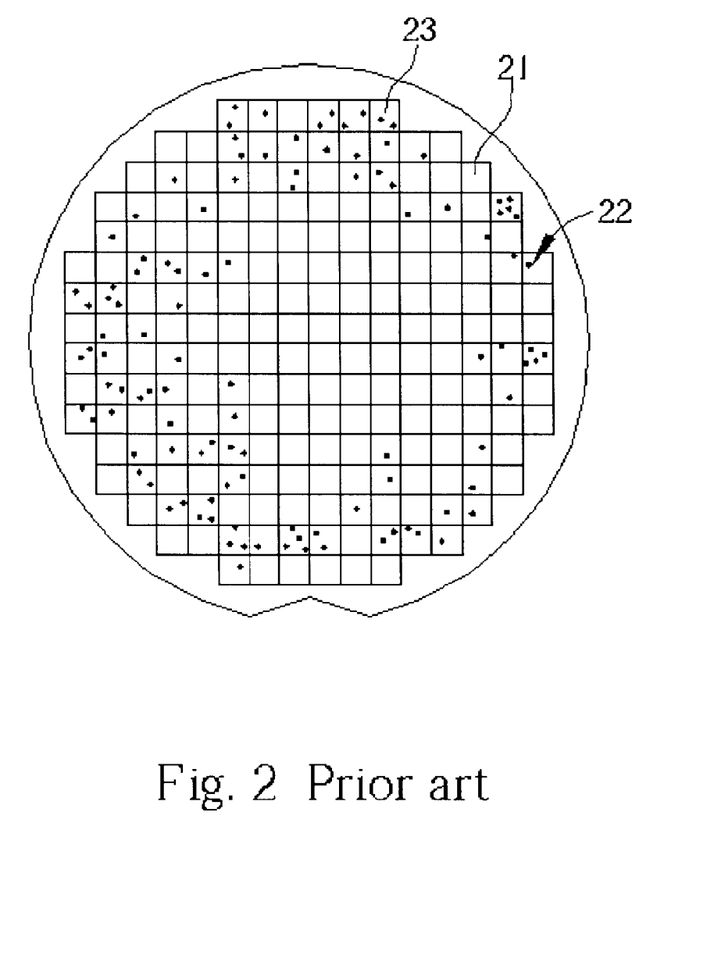
FIG. 2 is a schematic diagram of a defect inspection parameter distribution map for a wafer.

Step 102 is thereafter executed to find out the products having abnormal defect inspection results by reviewing the results of each defect inspection item of each wafer. Please refer to FIG. 2. FIG. 2 is a schematic diagram of a defect inspection parameter distribution map for a wafer. As shown in FIG. 2, a wafer is divided into a plurality of dies 21. A plurality of black dots represent the sites of defects 22 occurring in a specific layer on the wafer.

In step 103, those of ordinary skill in the art determine the possibly faulty process step according to personal experience and the defect distribution maps of abnormal products obtained from step 102. For example, the possibly faulty process step may be a process step for forming a polysilicon layer, a metal layer, an intermetal dielectric layer, etc.

Finally, those of ordinary skill in the art find out the ill-functioned equipment by checking the equipment utilized in the process step determined in step 103. For example, those of ordinary skill in the art judge that the products are out of spec according to the total count of defects in the intermetal dielectric layer first, then determine the possibly faulty process step to be the intermetal dielectric layer deposition process step, and eventually find out the ill-functioned equipment, such as the depositing equipment, the etching equipment, etc.

Since the analysis results are determined according to humans experience (step 103) in the prior art, the accuracy and the confidence level of the final analysis results are open to question. Furthermore, the human affairs in semiconductor manufacturing change frequently. Engineer's personal experience is difficult to transfer. The capacity of each engineer is limited, meaning the engineer is unable to look after the operation status of all of the equipment. When the defect inspection results indicate abnormalities, it is thus difficult for engineers, lacking in experience, to judge which point causes the problem to occur. Therefore, a lot of time is consumed to do related research, and even worse, wrong decisions are made. This will not only reduce the efficiency of processes, but also increase the cost, Furthermore, the in-line production status can not be improved in time to increase yield rate.

It is therefore very important to provide an analytical-method to rapidly and correctly judge which point causes the problem to occur when the defect inspection data of semiconductor products indicates abnormalities.

SUMMARY OF INVENTION

It is a primary objective of the claimed invention to provide a method for analyzing defect inspection parameters to rapidly and correctly judge which point causes the problem to occur when the defect inspection data of semiconductor products indicates abnormalities.

It is another primary objective of the claimed invention to provide a method for analyzing defect inspection parameters to revise the kill ratio of the defect inspection according to the results of defect inspection and wafer test.

It is a feature of the claimed invention to utilize the commonality analysis means to analyze defect inspection parameters by coordinating with the database recording each defect inspection item and correlated processing equipment.

The claimed invention method for analyzing defect inspection parameters are utilized for analyzing a plurality of lots of products. Each of the plurality of lots of products has a lot number. The plurality of lots of products are fabricated through a plurality of manufacturing equipment. At least one wafer in each of the plurality of lots of products is inspected according to at least one defect inspection item to generate at least one defect inspection parameter. The defect inspection item, the defect inspection parameter, and a process step correlated to the defect inspection item are stored in a database. The method includes: searching for the defect inspection parameters of the plurality of lots of products from the database, classifying the plurality of lots of products into at least a qualified group and a failed group according to the defect inspection parameters, searching for the process step correlated to the defect inspection item from the database, searching for the manufacturing equipment through which the qualified group has passed in the process step and the manufacturing equipment through which the failed group has passed in the process step, and determining the manufacturing equipment through which the probability that the failed group has passed which is greater than that of the qualified group.

Each wafer of each lot of products is tested according to a wafer test item correlated to the defect inspection item to generate a wafer test parameter. The wafer test item and the wafer test parameter are stored in the database. The present invention method for analyzing defect inspection parameters utilizes the overlapping means to compare the wafer test parameter distribution map and the defect distribution map to find out optimum kill ratio of the defect inspection.

It is an advantage of the claimed invention to utilize the commonality analysis means to analyze the defect inspection parameters by coordinating with the database recording each defect inspection item and related processing equipment. Therefore, the point causing the problem to occur is judged rapidly and correctly to find out the ill-functioned equipment when the defect inspection data of semiconductor products indicates abnormalities. Furthermore, the kill ratio of the defect inspection is revised according to the results of defect inspection and wafer test to avoid mistakes incurred from human's judgment, leading to higher processing efficiency, lower cost, and better in-line production status control to increase yield rate.

These and other objectives of the claimed invention will no doubt become obvious to those of ordinary skill in the art after reading the following detailed description of the preferred embodiment that is illustrated in the various figures and drawings.

DETAILED DESCRIPTION

In the following, relevant figures are referred to illustrate the method for analyzing the defect inspection parameters according to a preferred embodiment of the present invention. The same components are narrated with the same reference symbols.

Figure 3:
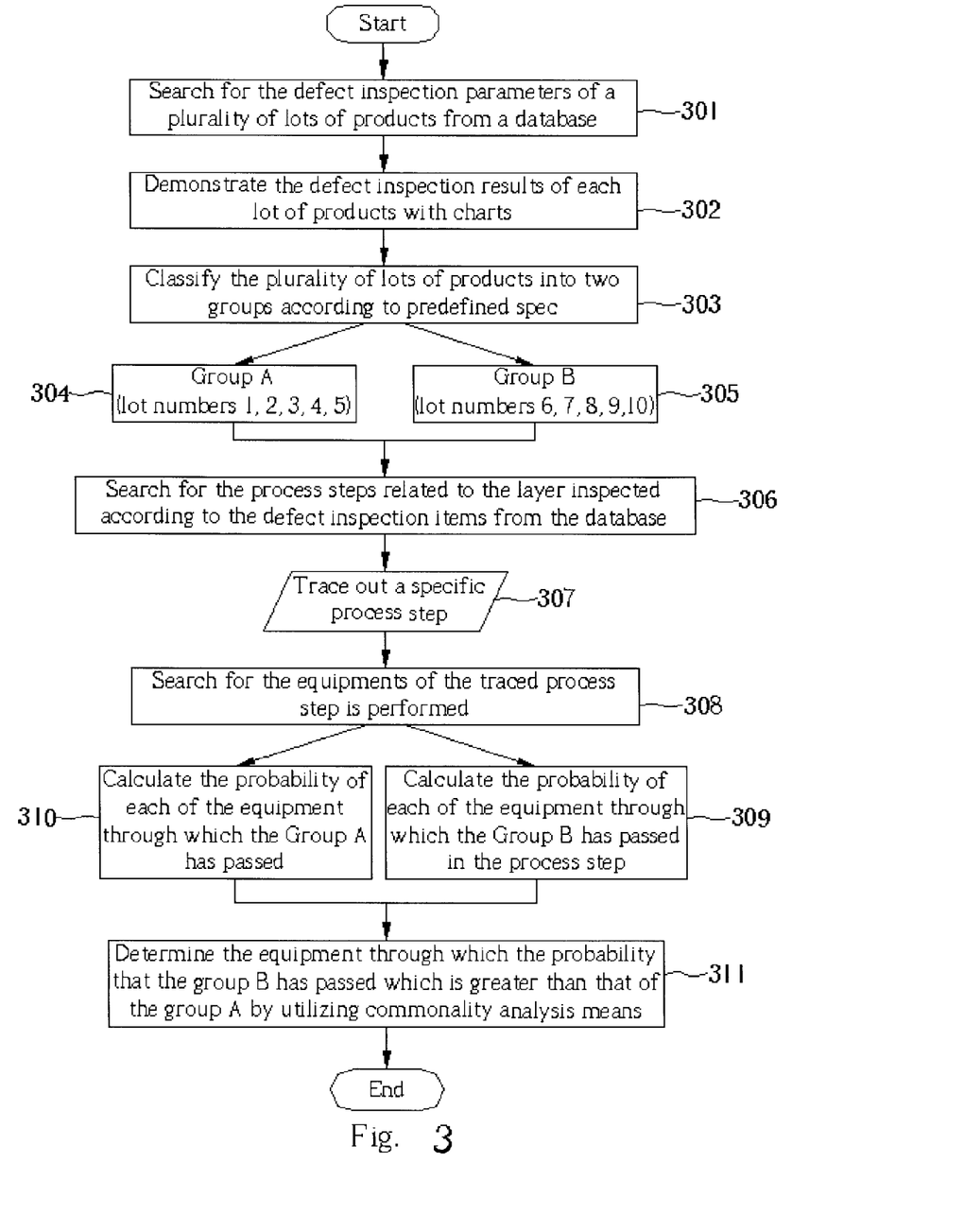
FIG. 3 is a flow chart of a method for analyzing defect inspection parameters according to a preferred embodiment of the present invention.

Please refer to FIG. 3. FIG. 3 is a flow chart of a method for analyzing defect inspection parameters according to the preferred embodiment of the present invention. The method is used for rapid and correct judging which equipment causes the problem to occur when the defect inspection data of semiconductor products indicates abnormalities.

As shown in FIG. 3, step 301 is first executed to search for the defect inspection parameters of a plurality of lots of products. Each lot of products, having a lot number, includes twenty-five pieces of wafers. Each lot of products is fabricated through a plurality of equipment of a plurality of process steps. At least one wafer in each lot of products is inspected according to at least one defect inspection item to generate at least one defect inspection parameter. In the preferred embodiment of the present invention, the defect inspection results can be classified into the total count of defects, the adder count of defects, and the class count of defects. The defect inspection parameters may be represented by a defect distribution map. For example, the defect distribution map for the adder count of defects is shown in FIG. 2. Each of a plurality of black dots, distributed over a plurality of dies 21 on the wafer, respectively represents a defect 22. It is worth noticing that defects may occur in different layers on the wafer to result in more than one defect distribution map for one wafer.

Step 302 is thereafter executed to demonstrate the defect inspection results of each lot of products with charts. In the preferred embodiment of the present invention, a histogram chart is utilized to represent the defect inspection parameters, such as the total count of defects, the adder count of defects, and the class count of defects, of each lot of products. By observing the histogram chart, engineers are able to realize the defect inspection parameter distribution.

In step 303, the plurality of lots of products acquired in step 301 are classified into at least two groups. The classifying criterion is whether each of the defect inspection parameters is within the predefined spec or not. The plurality of lots of products are classified into a qualified group and a failed group. According to the preferred embodiment of the present invention, the plurality of lots of products whose defect inspection parameters are within the predefined spec are classified as group A (qualified group). For example, the products from lots numbers 1, 2, 3, 4, and 5 are classified as group A (as shown in step 304). The plurality of lots of products whose defect inspection parameters are not within the predefined spec are classified as group B (failed group). For example, the products from lots numbers 6, 7, 8, 9, and 10 are classified as group B (as shown in step 305).

After that, step 306 is executed to search for the process steps correlated to the specific layers inspected according to the defect inspection items from another database set up from accumulative experience. For example, if the defect inspection items are performed on an intermetal dielectric layer, the correlated process steps can be the process step for depositing the dielectric layer after the first metal layer, the photolithography process step, or the etching process step. In the preferred embodiment of the present invention, the database set up from accumulative experience includes the experience of senior engineer acquired from problem tracing and the data derived from the computer system according to the present invention method.

Step 307 is executed to trace out a specific process step after the process steps correlated to the specific layers inspected according to the defect inspection items are acquired from the database, set up from accumulative experience, in step 306.

Step 308 is then executed to search for the equipment through which the traced process step is performed. For example, equipment numbers E1, E2, E3, etc. are acquired. Step 309 is thereafter executed to calculate the probability of each of the equipment through which the Group B has passed in the process step, and Step 310 is executed to calculate the probability of each of the equipment through which the Group A has passed. Finally, Step 311 is executed to determine the equipment through which the probability that the group B has passed which is greater than that of the group A, by utilizing the commonality analysis means. The equipment through which the probability that the group B has passed which is greater than that of the group A, determined in Step 311, is the possibly faulty equipment analyzed according to the analytical method for the defect inspection parameters in the preferred embodiment of the present invention.

Figure 4:
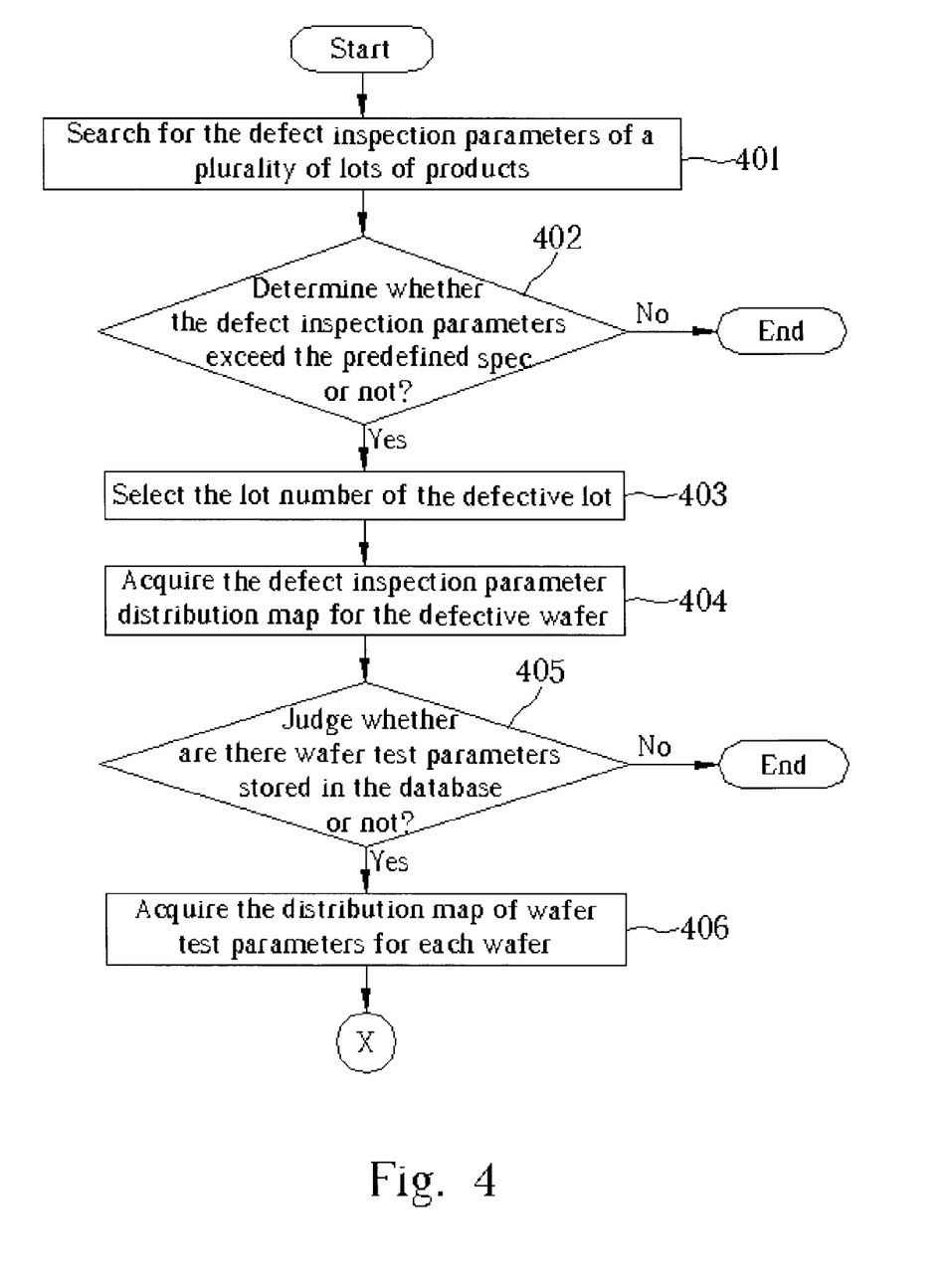
FIG. 4 and FIG. 5 are flow charts of a method for analyzing defect inspection parameters according to another preferred embodiment of the present invention.
Figure 5:
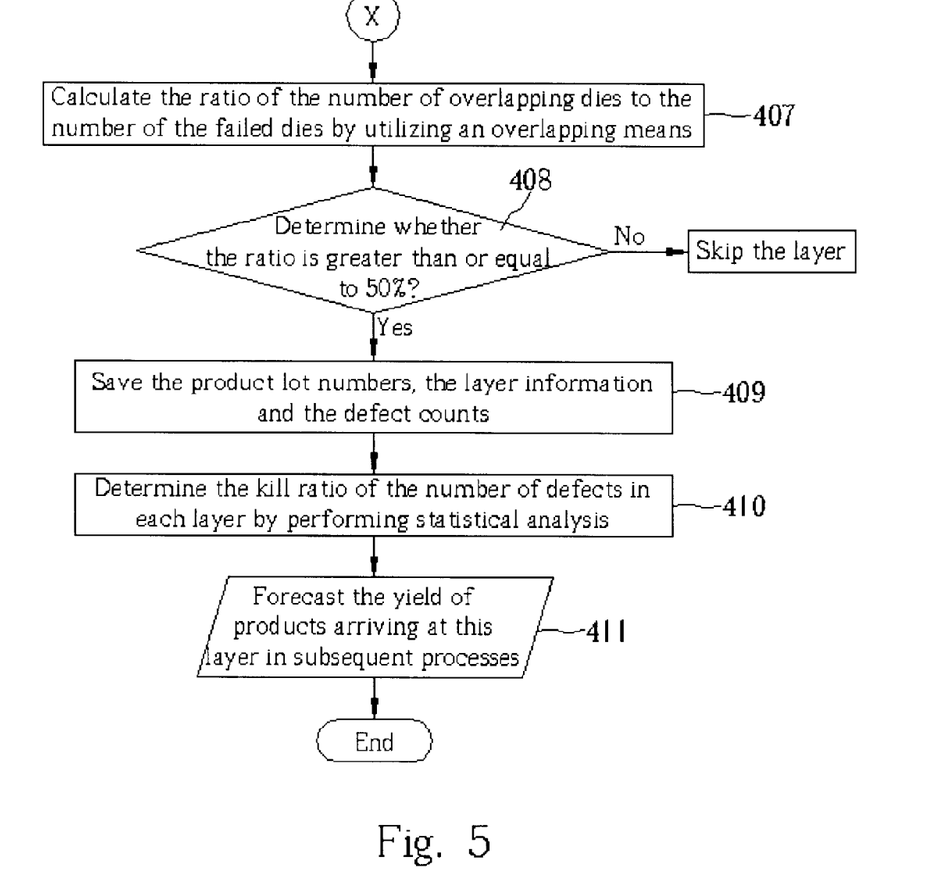

Please refer to FIG. 4 and FIG. 5. FIG. 4 and FIG. 5 are flow charts of a method for analyzing defect inspection parameters according to another preferred embodiment of the present invention. This method is used for revising the criterion for defect quantity according to defect distribution and wafer test results. According to this preferred embodiment of the present invention, each wafer in each lot of products is inspected according to a wafer test item to generate a wafer test parameter. The wafer test items, the wafer test parameters, and the correlation between the defect inspection items and the wafer test items are stored in a database.

As shown in FIG. 4 and FIG. 5, step 401 is first executed to search for the defect inspection parameters of a plurality of lots of products. As mentioned previously, each lot of products, having a lot number, includes twenty-five pieces of wafers. At least one wafer in each lot of products is inspected according to the defect inspection item, and each wafer is tested according to the wafer test item. Therefore, the defect inspection parameters and the wafer test parameters are generated. In this preferred embodiment of the present invention, the defect inspection parameters may be represented by a defect distribution map (as shown in FIG. 2). Each of a plurality of black dots, distributed over a plurality of dies 21 on the wafer, respectively represents a defect 22. The dies having black dot inside are defective dies 23. It is worth noticing that defects may occur in different layers on the wafer to result in more than one defect distribution map for one wafer.

Step 402 is thereafter executed to determine whether the defect inspection parameters of each lot of products, acquired in Step 401, exceed the predefined spec or not. Generally speaking, the predefined spec for the defect inspection parameters is a range. In this step, whether the acquired defect inspection parameters of each lot of products exceed the predefined upper control limit (UCL) or not is judged. In addition, the defect inspection item analyzed in this step may be the total count of defects, the adder count of defects, and the class count of defects. According to this preferred embodiment of the present invention, each wafer in each lot of products is searched in Step 402. If the defect inspection parameters of more than one wafer in one lot of products exceed the predefined spec, then execute Step 403 to select the lot number of that lot. If not, stop analyzing. After that, Step 404 is executed to acquire the defect inspection parameter distribution map for the defective wafer.

Figure 6:
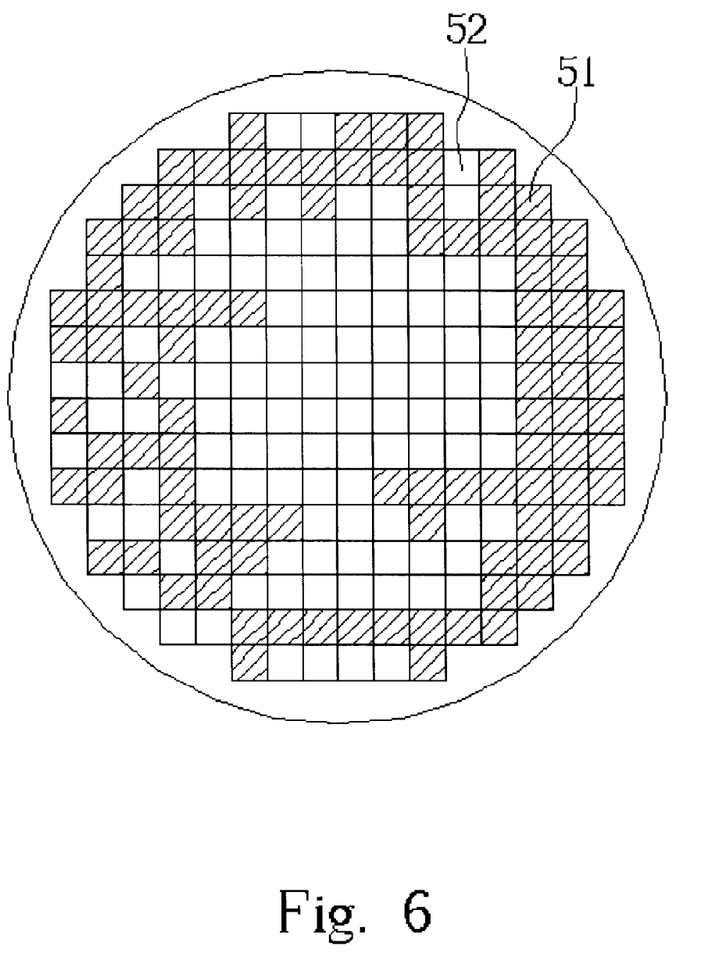
FIG. 6 is a schematic diagram of a wafer test parameter distribution map according to another preferred embodiment of the present invention.

Step 405 is then executed to judge whether the wafer test parameters of that lot of products, whose lot number was selected in Step 403, are stored in the database or not. In this preferred embodiment of the present invention, the wafer test parameters can be represented by a wafer test parameter distribution map. Please refer to FIG. 6. FIG. 6 is a schematic diagram of a wafer test parameter distribution map according to another preferred embodiment of the present invention. As shown in FIG. 6, a wafer is divided into a plurality of dies including a plurality of failed dies 51 (indicated with black color) and a plurality of qualified dies 52 (indicated with white color). If the wafer test parameters are stored in the database according to the judgment made in Step 405, Step 406 is executed to acquire the wafer test parameter distribution map for each wafer in that lot of products. If not, stop analyzing. It is worth noticing that the wafer test parameters searched and analyzed in Steps 405, 406 are testing results of wafer test items correlated to defect inspection items, such as results of the function test item and the $I_{DDQ}$ test item.

After that, Step 407 is executed to compare the defect distribution map acquired in Step 404 with the wafer test parameter distribution map acquired in Step 406 by utilizing an overlapping means. The number of overlapping dies is thus determined to calculate a ratio of the number of overlapping dies to the number of the failed dies. In this step, the number of overlapping dies is equal to the quantities of the defect dies and the failed dies in the overlapping portion. Step 408 is then executed to determine whether the ratio is greater than or equal to a predefined value or not, for example: 50%. If not, skip this layer. After all of the layers are skipped, stop analyzing. If the ratio is greater than or equal to the predefined value, goes to Step 409.

In step 409, the product lot numbers, the data for the layers, and defect counts of the products, analyzed according to the above-mentioned analytical steps, are selected. In this preferred embodiment of the present invention, the layer analyzed according to the above-mentioned analytical steps is marked as a defective layer in this step. Then the lot of products including the wafer having the defective layer is searched to select the product lot number, the data for layers, and the count of defects.

Step 410 is executed to perform a statistical analysis. A representative value, being the kill ratio of the number of defects in the layer, is determined. Furthermore, the yield for products arriving at this layer in subsequent processes is forecasted according to the kill ratio and the method for analyzing defect inspection parameters in the preferred embodiment of the present invention.

In summary, the present invention method for analyzing the defect inspection parameters utilizes the commonality analysis means to analyze the defect inspection parameters, by coordinating with the database recording each defect inspection item and correlated processing equipment. Therefore, the point which causes the problem to occur is judged rapidly and correctly to find out the ill-functioned equipment when the defect inspection data of semiconductor products indicates abnormalities. In addition, the kill ratio of the defect inspection is revised according to the results of defect inspection and wafer test to avoid mistakes incurred from human's judgment, leading to higher processing efficiency, lower cost, and better in-line production status control to increase yield rate.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method for analyzing defect inspection parameters, the method being utilized for analyzing a plurality of lots of products, each of the plurality of lots of products having a lot number, the plurality of lots of products being fabricated through a plurality of manufacturing equipment, at least one wafer in each of the plurality of lots of products being inspected according to at least one defect inspection item to generate at least one defect inspection parameter, the defect inspection item, the defect inspection parameter, and a process step correlated to the defect inspection item being stored in a database, the method comprising:

searching for the defect inspection parameters of the plurality of lots of products from the database;

classifying the plurality of lots of products into at least two groups according to the defect inspection parameters, the groups comprising a qualified group and a failed group;

searching for the process step correlated to the defect inspection item from the database;

searching for the manufacturing equipment through which the qualified group has passed in the process step;

searching for the manufacturing equipment through which the failed group has passed in the process step; and determining the manufacturing equipment through which the probability that the failed group has passed which is greater than that of the qualified group.

2. The method of claim 1, wherein a commonality analysis means is utilized to determine the manufacturing equipment through which the probability that the failed group has passed which is greater than that of the qualified group.

3. The method of claim 1, wherein the defect inspection parameter comprises a total count of defects, an adder count of defects, or a class count of defects.

4. The method of claim 3 further comprising:
utilizing a histogram chart to represent the defect inspection parameters of the plurality of lots of products.

5. The method of claim 1, wherein each wafer of the plurality of lots of products is tested according to a wafer test item correlated to the defect inspection item to generate a wafer test parameter, the wafer test item and the wafer test parameter are stored in the database, the method further comprising:
determining if the defect inspection parameters of the plurality of lots of products are greater than a first standard value;
acquiring the lot numbers of products having defects if the defect inspection parameters of the plurality of lots of products are greater than the first standard value;
acquiring a plurality of layers on each wafer having defects in the lot of products, each layer being represented by a defect distribution map having a plurality of defect dies;
searching for the wafer test parameter distribution map for each wafer in the lot of products having defects, the wafer test parameter distribution map having a plurality of failed dies;
overlapping the defect distribution map of each layer with the wafer test parameter distribution map to acquire a number of overlapping dies, wherein the number of overlapping dies is equal to the overlapping number of the defect dies and the failed dies;
calculating a ratio of the number of overlapping dies to the number of the failed dies for each layer;
determining if the ratio is greater than or equal to a second standard value;
skipping layer which has ratio smaller than the second standard value;
marking layer which has ratio greater than or equal to the second standard value as a defective layer; and
searching for products and their lot numbers which contain at least one wafer comprising the defective layer.

6. The method of claim 5 further comprising:
utilizing the statistical analysis means to generate a third standard value representing a kill ratio of the defective layer according to the number of defects in the defective layer.

7. The method of claim 6 further comprising:
forecasting the yield for products arriving at the defective layer in subsequent processes according to the third standard value.

8. The method of claim 5 further comprising:
determining if the wafer test parameters are stored in the database;
stopping searching if the wafer test parameters are not stored in the database; and
acquiring the wafer test parameter distribution map for each wafer in the lot of products having defects if the wafer test parameters are stored in the database.

9. The method of claim 5, wherein the wafer test item is a function test item.

10. The method of claim 5, wherein the wafer testing inspection item is an $I_{DDQ}$ test item.

* * * * *